(12) United States Patent
Kim et al.

(10) Patent No.: US 7,138,721 B2
(45) Date of Patent: Nov. 21, 2006

(54) MEMORY MODULE

(75) Inventors: Chang-Hyun Kim, Gyeonggi-do (KR); Kyung-Ho Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/925,987

(22) Filed: Aug. 26, 2004

(65) Prior Publication Data

US 2005/0047248 A1   Mar. 3, 2005

(51) Int. Cl.
 *H01L 23/48* (2006.01)
 *H01L 23/52* (2006.01)
 *H01L 29/40* (2006.01)

(52) U.S. Cl. .................. 257/777; 257/E23.01

(58) Field of Classification Search ........... 257/685, 257/686, 690–692, 693, 698, 700, 722, 724, 257/773, 774, 776, 777, 783, 784, 786, 734, 257/723; 438/109, 612, 614; 361/735, 767, 361/772, 773, 774, 777
See application file for complete search history.

(56) References Cited

U.S. PATENT DOCUMENTS 5,473,192 A   12/1995   Golubic et al.
5,701,233 A * 12/1997   Carson et al. ............ 361/735
6,534,874 B1 * 3/2003   Matsumura ................ 257/777

FOREIGN PATENT DOCUMENTS

| JP | 3-250662 | 11/1991 |
|----|----------|---------|
| JP | 09-147545 | 6/1997 |
| KR | 2000-0040591 | 7/2000 |
| KR | 2000-0073566 | 12/2000 |
| WO | WO 02/28662 A1 | 4/2002 |

\* cited by examiner

*Primary Examiner*—B. William Baumeister
*Assistant Examiner*—Dana Farahani
(74) *Attorney, Agent, or Firm*—Volentine Francos & Whitt

(57) ABSTRACT

A memory module includes a substrate having a common substrate body, a plurality of first memory chips located over a surface of the common substrate body, a conductive pattern which electrically connects at least some of the plurality of first memory chips, and an external terminal which is electrically connected to the conductive pattern. The memory module further includes at least one second memory chip mounted over a respective one of the plurality of first memory chips and electrically connected to the conductive pattern, where each one of the plurality of first memory chips mounted below the at least one second memory chip is disabled.

19 Claims, 7 Drawing Sheets

MEMORY MODULE

BACKGROUND OF THE INVENTION

1. Field of the Invention

The present invention relates to a memory module, and more particularly, to a memory module having memory chips formed on a common substrate.

2. Description of the Related Art

Efforts have been ongoing to integrate different types of memories, such as dynamic random access memories (DRAMs), static random access memories (SRAMs) and/or flash memories, in parallel into a single memory module. See, for example, German patent publication DE 19626337A1, which suggests concurrent usage of chips containing volatile and nonvolatile memories.

Also, the so-called "Fusion Memory" has recently been suggested in which high density memory and logic circuits are integrated on a single chip. The memory circuits may include different types of memories on the single chip, such as DRAM, SRAM and flash memories. Attributes of the Fusion Memory may thus include the large storage capacity of a DRAM, the high speed data processing of an SRAM, and the nonvolatile storage of a flash memory. These attributes, coupled with on-chip logic circuits, allow for customization of the chip to meet desired specifications.

In the meantime, research has been conducted to fabricate a wafer-scale memory module in which a plurality of memory devices of the same type are formed and interconnected at the wafer level. See, for example, Japanese Patent Laid Open Publication No. 3-250662. According to this publication, in the event a defective device exists among the plurality of memory devices, a non-defective device is mounted on the defective device.

Wafer-scale memory modules are highly integrated and can be formed with smaller dimensions and lighter weights when compared with more conventional memory modules having memory chips mounted on a printed circuit board (PCB).

There exists a desire for a memory module which exhibits the attributes of wafer-scale technologies, while also allowing for a variety of memory functions to be integrated onto a common substrate.

SUMMARY OF THE INVENTION

Advantages, objects, and features of the invention will be set forth in part in the description which follows and in part will become apparent to those having ordinary skill in the art upon examination of the following or may be learned from practice of the invention. The objectives and other advantages of the invention may be realized and attained by the structures particularly pointed out in the written description and claims hereof as well as the appended drawings.

According to a first aspect of the present invention, a memory module is provided which includes a substrate having a common substrate body, a plurality of first memory chips located over a surface of the common substrate body, a conductive pattern which electrically connects at least some of the plurality of first memory chips, and an external terminal which is electrically connected to the conductive pattern. The memory module further includes at least one second memory chip mounted over a respective one of the plurality of first memory chips and electrically connected to the conductive pattern, where each one of the plurality of first memory chips mounted below the at least one second memory chip is disabled.

Each second memory chip may be electrically connected to the conductive pattern by wiring extending between a pad of each second memory chip and the conductive pattern, or each second memory chip may be electrically connected to the conductive pattern by a via hole and conductive plug extending through the second memory chip and electrically contacting a pad of the first memory chip.

Each one of the plurality of first memory chips mounted below a second memory chip may be disabled by an electrical disconnection from the conductive pattern, or by a cut power supply fuse.

A memory type of each of the plurality of first memory chips may be independently any one of a DRAM, an SRAM or a flash memory. The memory type of each second memory chip may also independently be any one of a DRAM, an SRAM or a flash memory. The memory type of each second memory chip may be different than the memory type of the first memory chips.

According to another aspect of the present invention, a memory module is provided which includes a substrate, a first memory chip located over a surface of the substrate, a conductive pattern electrically connected to pads of the first memory chip, an external terminal which is electrically connected to the conductive pattern, a stacked plurality of second memory chips mounted over the first memory chip and having via holes aligned with the pads of the first memory chip, and conductive plugs respectively contained in the via holes of the stacked plurality of second memory chips and electrically contacting a respective one of the pads of the first memory chip.

A memory type of the first memory chip may be any one of a DRAM, an SRAM or a flash memory. The memory type of each second memory chip may independently be any one of a DRAM, an SRAM and a flash memory. The memory type of each second memory chip may be different than the memory type of the first memory chip.

BRIEF DESCRIPTION OF THE DRAWINGS

The accompanying drawings, which are included to provide a further understanding of the invention, and are incorporated in, and constitute a part of this disclosure, illustrate embodiments of the invention and together with the description serve to explain the principles of the invention. In the drawings.

DETAILED DESCRIPTION OF PREFERRED EMBODIMENTS

Reference will now be made in detail to preferred embodiments of the present invention, examples of which are illustrated in the accompanying drawings. However, the present invention is not limited to the embodiments illustrated herein, and the embodiments herein are instead presented to facilitate understanding of the overall scope and spirit of the present invention.

Figure 1:
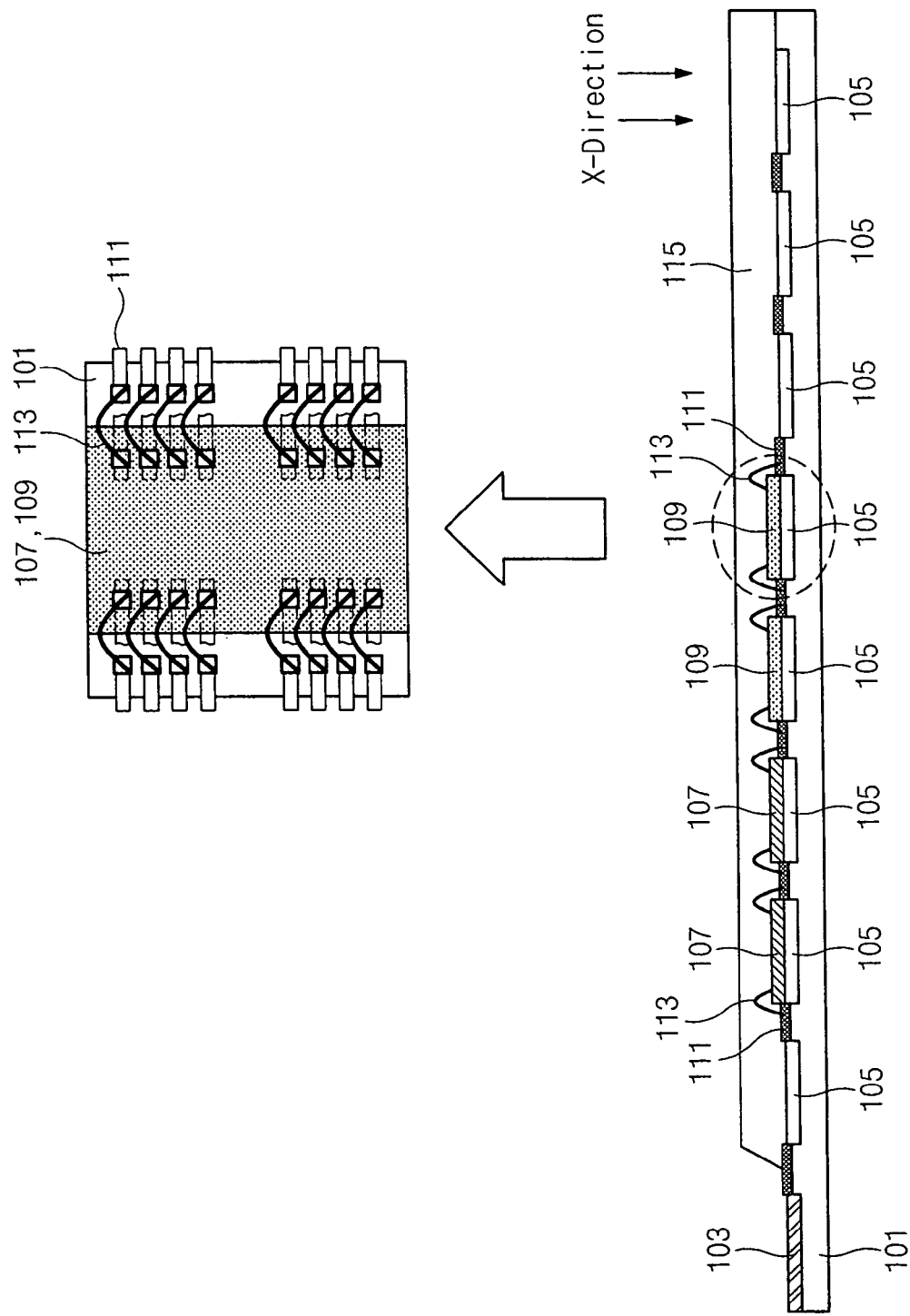
FIG. 1 illustrates a memory module according to a first embodiment of the present invention.

FIG. 1 illustrates a memory module according to a first embodiment of the present invention in which memory chips are horizontally arranged over a common substrate.

Referring to FIG. 1, the memory module includes a common substrate 101, first memory chips 105 at the surface of the common substrate 101, and second memory chips 107 and 109 mounted over some of the first memory chips 105. The first memory chips 105 and second memory chips 107 and 109 can be formed on silicon wafers using known semiconductor memory chip manufacturing processes. Further, the substrate 101 may be obtained by cutting/dicing a wafer on which the first memory chips 105 are already formed. On the other hand, the second memory chips 107 and 109 may be individually cut/diced from one or more wafers, and then individually mounted over a respective one of the first memory chips 105. Mounting of the second memory chips 107 and 109 can take place before or after the substrate 101 with the first memory chips 105 is cut/diced from the wafer. Although not shown, one or more layers, such as insulating layers, may be interposed between the first memory chips 105 and the second memory chips 107 and 109.

The memory type of each of the plurality of first memory chips 105 may be independently any one of a DRAM, an SRAM or a flash memory. Likewise, the memory type of each of the second memory chips 107 and 109 may be independently any one of a DRAM, an SRAM or a flash memory. Further, the memory type of each of the second memory chips 107 and 109 may be different than the memory type of the first memory chips 105. In this exemplary embodiment, the first memory chips 105 are DRAMs, the second memory chips 107 are SRAMs, and the second memory chips 109 are flash memories.

An external input/output terminal 103 may be located at an edge region of the substrate 101, and is electrically connected to a conductive pattern 111 (e.g., a metal trace or line). The conductive pattern 111 electrically connects adjacent memory chips 105, 107 and 109. In this exemplary embodiment, pads of the first memory chips 105 are connected at the wafer-level to the conductive pattern 111, and pads of the second memory chips 107 and 109 are connected to the conductive pattern 111 via metal wirings 113 using a conventional wiring bonding technique. Although not shown in the drawings, the common input/output terminal 103 can be constituted of separate input and output terminals.

Each of the first memory chips 105 having a second memory chip 107 or 109 mounted thereon is disabled. Disabling of the first memory chips 105 can be achieved in a variety of different manners. For example, each first memory chip 105 to be disabled can be operatively disconnected from the conductive pattern 111 as illustrated in the top view of FIG. 1. As other examples, the first memory chips 105 may be configured with exposed main power supply fuses which can be selectively cut, or the first memory chips 105 may be configured with a logic circuit that disables chip operations in response to a given command signal.

Reference number 115 of FIG. 1 denotes a resin or the like which is formed over the substrate 101 to physically protect the memory module components from environmental hazards.

The memory module shown in FIG. 1 may optionally be fabricated as follows. First, the common substrate 101, the first memory chips 105, the conductive pattern 111, and the input/output terminal 103 are formed at the wafer level using wafer-scale technology. The wafer is then cut or diced according to design specifications (this step can conducted later in the fabrication process). Some of the first memory chips 105 are then disabled, for example, by cutting the conductive pattern 111 to isolate some of the first memory chips 105. The second memory chips 107 and 109 are mounted on the disabled first memory chips 105, and wire-bonded to the conductive pattern 111. A protective resin 115 is then formed over the resultant structure.

The memory module of the first embodiment of FIG. 1 advantageously exhibits the attributes of wafer-scale technologies, while also allowing for a variety of memory functions to be integrated onto a single chip.

Figure 2:
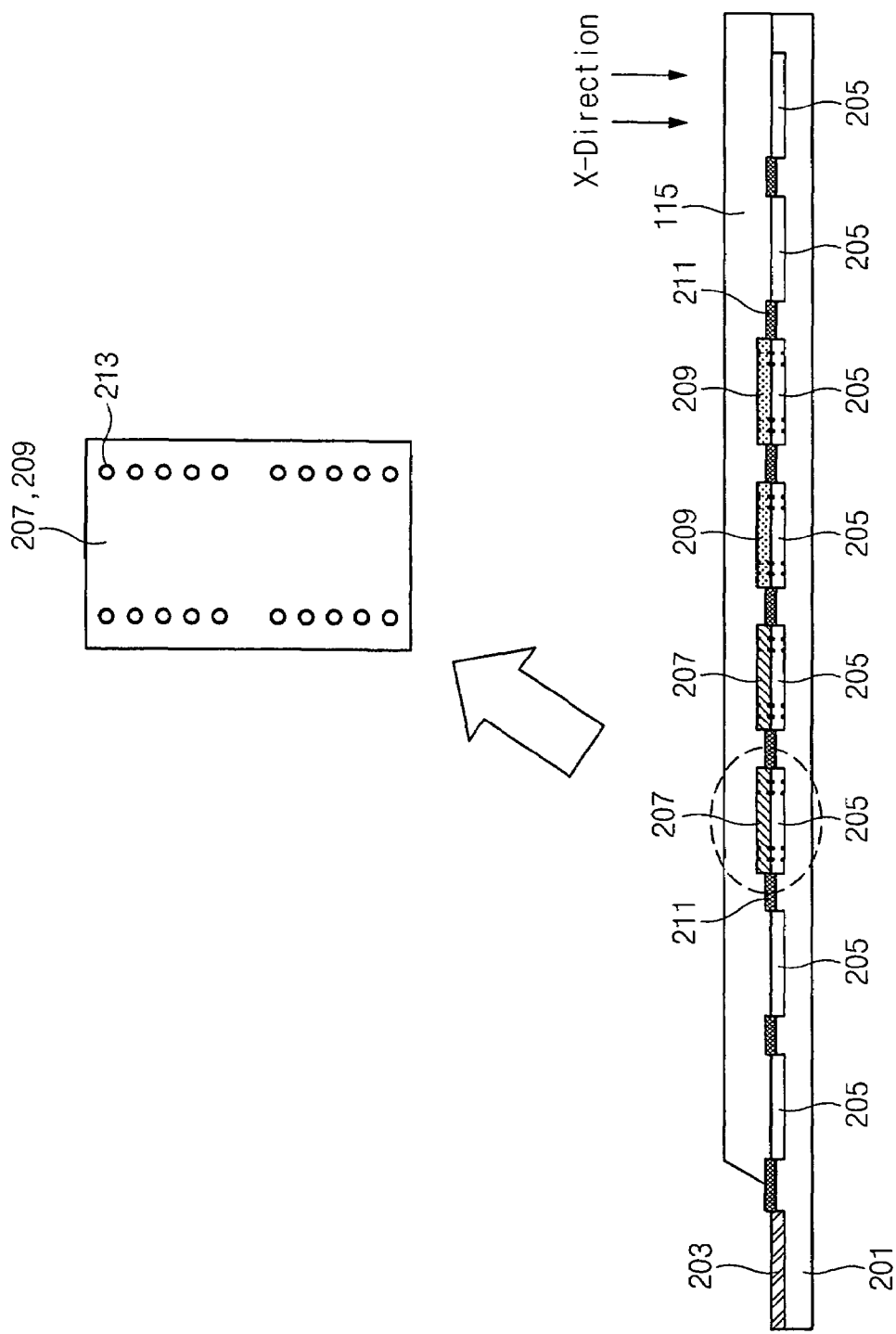
FIG. 2 illustrates a memory module according to a second embodiment of the present invention.

FIG. 2 illustrates a memory module according to a second embodiment of the present invention in which memory chips are horizontally arranged over a common substrate.

Referring to FIG. 2, the memory module includes a common substrate 201, first memory chips 205 at the surface of the common substrate 201, and second memory chips 207 and 209 mounted over some of the first memory chips 205. The first memory chips 205 and second memory chips 207 and 209 can be formed on silicon wafers using known semiconductor memory chip manufacturing processes. Further, the substrate 201 may be obtained by cutting/dicing a wafer on which the first memory chips 205 are already formed. On the other hand, the second memory chips 207 and 209 may be individually cut/diced from one or more wafers, and then individually mounted over a respective one of the first memory chips 205. Mounting of the second memory chips 207 and 209 can take place before or after the substrate 201 with the first memory chips 205 is cut/diced from the wafer. Although not shown, one or more layers, such as insulating layers, may be interposed between the first memory chips 205 and the second memory chips 207 and 209.

The memory type of each of the plurality of first memory chips 205 may be independently any one of a DRAM, an SRAM or a flash memory. Likewise, the memory type of each of the second memory chips 207 and 209 may be independently any one of a DRAM, an SRAM or a flash memory. Further, the memory type of each of the second memory chips 207 and 209 may be different than the memory type of the first memory chips 205. In this exemplary embodiment, the first memory chips 205 are DRAMs, the second memory chips 207 are SRAMs, and the second memory chips 209 are flash memories.

An external input/output terminal 203 may be located at an edge region of the substrate 201, and is electrically connected to a conductive pattern 211 (e.g., a metal trace or line). The conductive pattern 211 electrically connects adjacent memory chips 205, 207 and 209. In this exemplary embodiment, pads of the first memory chips 205 are connected at the wafer-level to the conductive pattern 211, and the second memory chips 207 and 209 are connected to the conductive pattern 211 by via holes 213 filled with conductive plugs which are formed in the second memory chips 207 and 209. Material examples of the conductive plugs include aluminum, copper and platinum. The via holes 213 are aligned with the pads of the respective first memory chips 205. The conductive plugs contained in the via holes 213 electrically contact the pads of the respective first memory chips 205, which in turn are electrically connected to the conductive pattern 211. Although not shown in the drawings, the common input/output terminal 203 can be constituted of separate input and output terminals.

Each of the first memory chips 205 having a second memory chip 207 or 209 mounted thereon is disabled.

Disabling of the first memory chips 205 can be achieved in a variety of different manners. For example, the first memory chips 205 may be configured with exposed main power supply fuses which can be selectively cut, or the first memory chips 205 may be configured with a logic circuit that disables chip operations in response to a given command signal.

Reference number 115 of FIG. 2 denotes a resin or the like which is formed over the substrate 201 to physically protect the memory module components from environmental hazards.

The memory module shown in FIG. 2 may optionally be fabricated as follows. First, the common substrate 201, the first memory chips 205, the conductive pattern 211, and the input/output terminal 203 are formed at the wafer level using wafer-scale technology. The wafer is then cut or diced according to design specifications (this step can be conducted later in the fabrication process). Some of the first memory chips 205 are then disabled, for example, by cutting of main power supply fuses to the first memory chips 205. The second memory chips 207 and 209 are mounted on the disabled first memory chips 205 such that the via holes 213 are aligned with the pads of the respective first memory chips 205. The via holes 213 are filled with the conductive plugs to electrically contact the pads of the respective first memory chips 205. The protective resin 115 is then formed over the resultant structure.

The memory module of the second embodiment of FIG. 2 advantageously exhibits the attributes of wafer-scale technologies, while also allowing for a variety of memory functions to be integrated onto a single chip.

Figure 3:
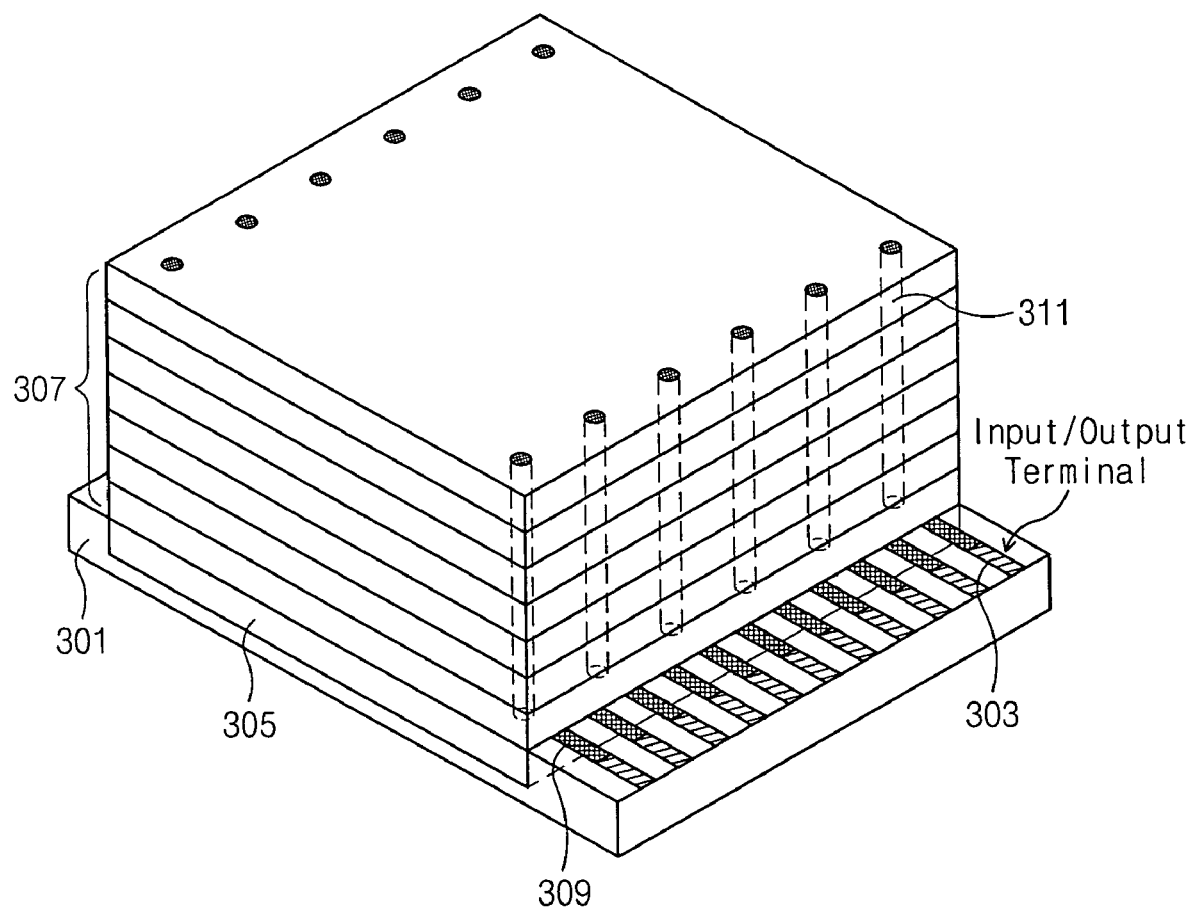
FIG. 3 illustrates a memory module according to a third embodiment of the present invention.

FIG. 3 illustrates a memory module according to a third embodiment of the present invention in which memory chips are vertically arranged over a common substrate.

Referring to FIG. 3, the memory module includes a common substrate 301, a first memory chip 305 at the surface of the common substrate 301, and second memory chips 307 vertically stacked over the first memory chip 305. The first memory chip 305 and second memory chips 307 can be formed on silicon wafers using known semiconductor memory chip manufacturing processes. Further, the substrate 301 may be obtained by cutting/dicing a wafer on which the first memory chip 305 is already formed. On the other hand, the second memory chips 307 may be individually cut/diced from one or more wafers, and then individually mounted over the first memory chip 305. Mounting of the second memory chips 307 can take place before or after the substrate 301 with the first memory chip 305 is cut/diced from the wafer. Although not shown, one or more layers, such as insulating layers, may be interposed between the first memory chips 305 and the second memory chips 307.

The memory type of each of the first memory chip 305 may be any one of a DRAM, an SRAM or a flash memory. Likewise, the memory type of each of the second memory chips 307 may be independently any one of a DRAM, an SRAM or a flash memory. Further, the memory types of the second memory chips 307 may be different from each other and/or different from the first memory chip 305. In this exemplary embodiment, the first memory chip 305 is a DRAM, and the second memory chips 307 are SRAMs, flash memories and DRAMs.

An external input/output terminal 303 is located at an edge region of the substrate 301, and is electrically connected to a conductive pattern 309 (e.g., a metal trace or line). The conductive pattern 309 is electrically connected at the wafer-level to pads of the first memory chip 305, and the second memory chips 307 are electrically connected to the conductive pattern 309 by via holes 311 filled with conductive plugs which are formed in the second memory chips 307. Material examples of the conductive plugs include aluminum, copper and platinum. The via holes 311 are aligned with the pads of the respective first memory chip 305. The conductive plugs contained in the via holes 311 electrically contact the pads of the respective first memory chips 305, which in turn are electrically connected to the conductive pattern 309. Although not shown in the drawings, the common input/output terminal 303 can be constituted of separate input and output terminals.

The memory module shown in FIG. 3 may optionally be fabricated as follows. First, the common substrate 301, the first memory chip 305, the conductive pattern 309, and the input/output terminal 303 are formed at the wafer level using wafer-scale technology. The wafer is then cut or diced according to design specifications (this step can conducted later in the fabrication process). The second memory chips 307 are vertically stacked over the first memory chip 305 such that the via holes 311 are aligned with the pads of the first memory chip 305. The via holes 311 are filled with the conductive plugs to electrically contact the pads of the respective first memory chip 305. Although not shown, a protective resin may then be formed over the resultant structure.

The memory module of the third embodiment of FIG. 3 advantageously exhibits the attributes of wafer-scale technologies, while also allowing for a variety of memory functions to be integrated onto a single chip. Also, when compared to the embodiments of FIGS. 1 and 2, the embodiment of FIG. 3 may have greater impact resistance and may be formed more compactly.

Figure 4:
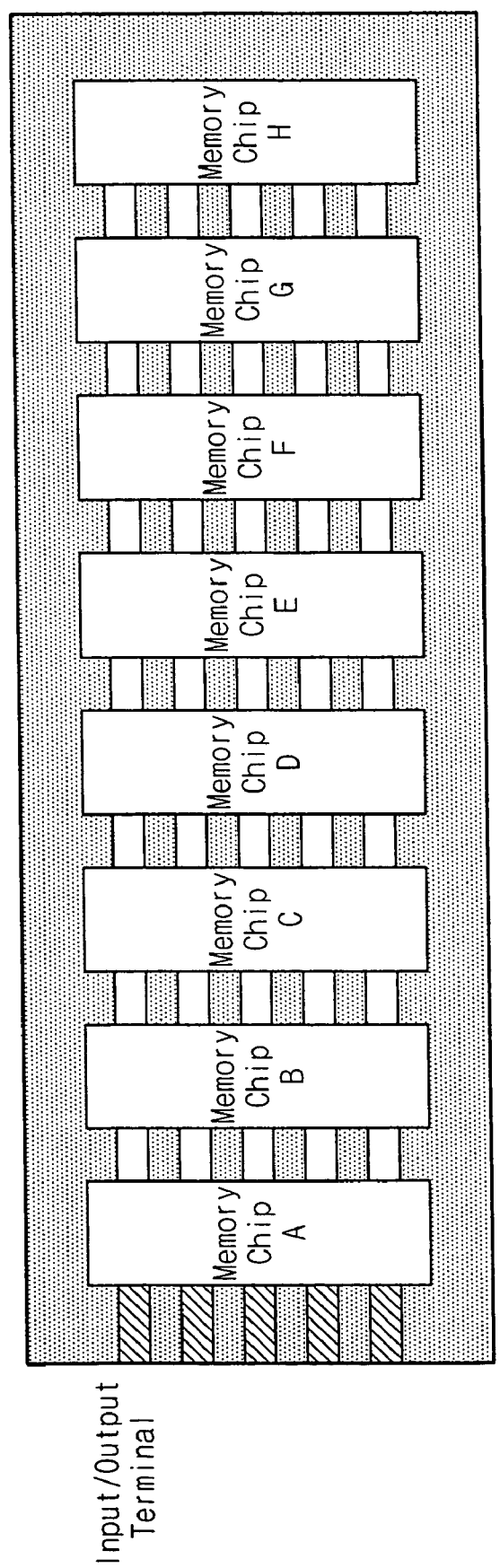
FIGS. 4 and 5 are schematic top views showing exemplary chip layouts of the memory modules according to the first and second embodiments of the present invention.
Figure 5:
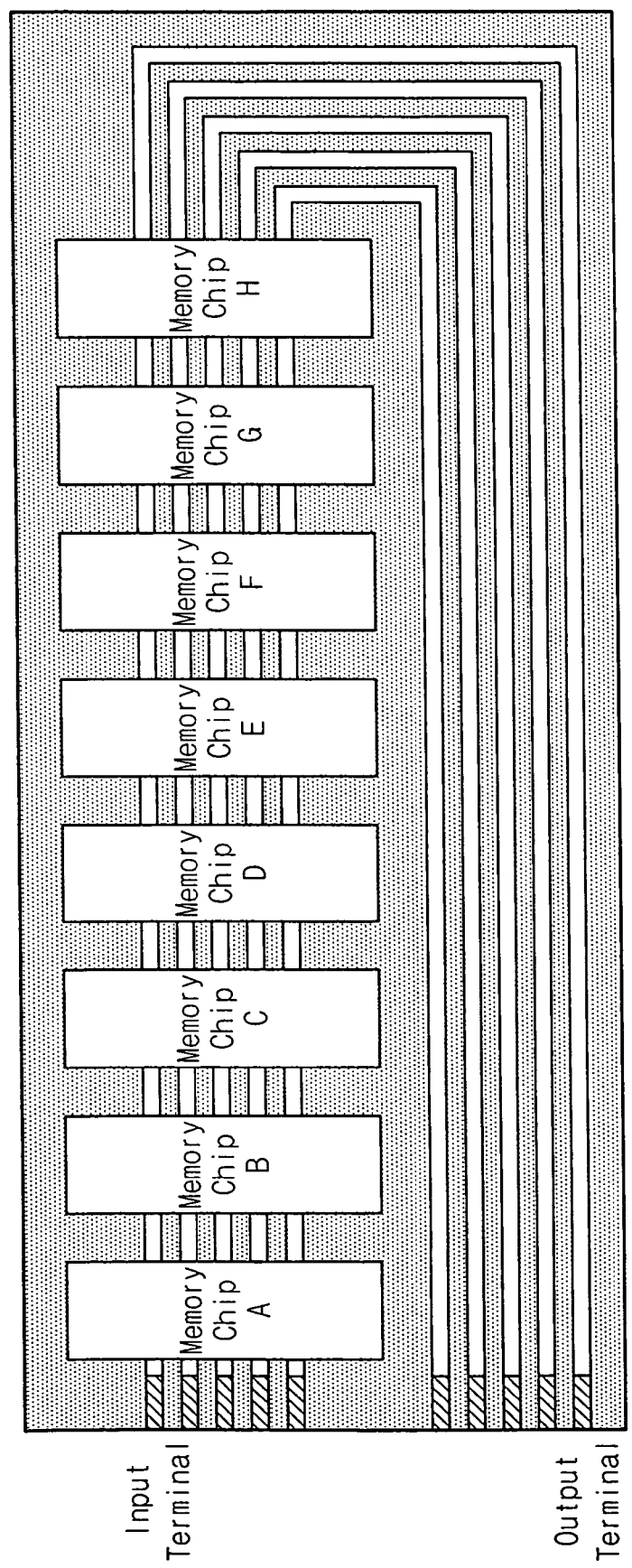

FIGS. 4 and 5 are schematic top views showing exemplary chip layouts of the memory modules according to the first and second embodiments of the present invention.

In the example of FIG. 4, memory chips A–H are connected in parallel by conductive patterns to a common input/output terminal located at the edge of the memory module. In the example of FIG. 5, the memory chips A–H are connected in parallel by conductive patterns to separate input and output terminals located at the edge of the memory module.

Figure 6A:
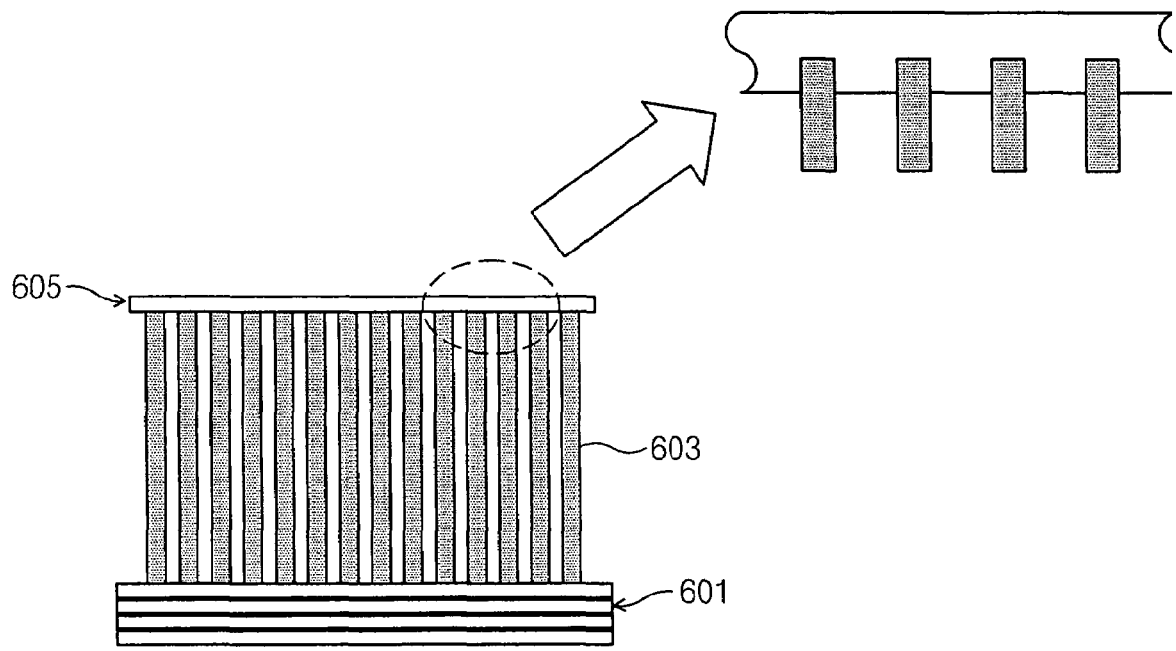
FIGS. 6A, 6B and 7 illustrate examples of the memory modules of the first and second embodiments mounted to a main board.
Figure 6B:
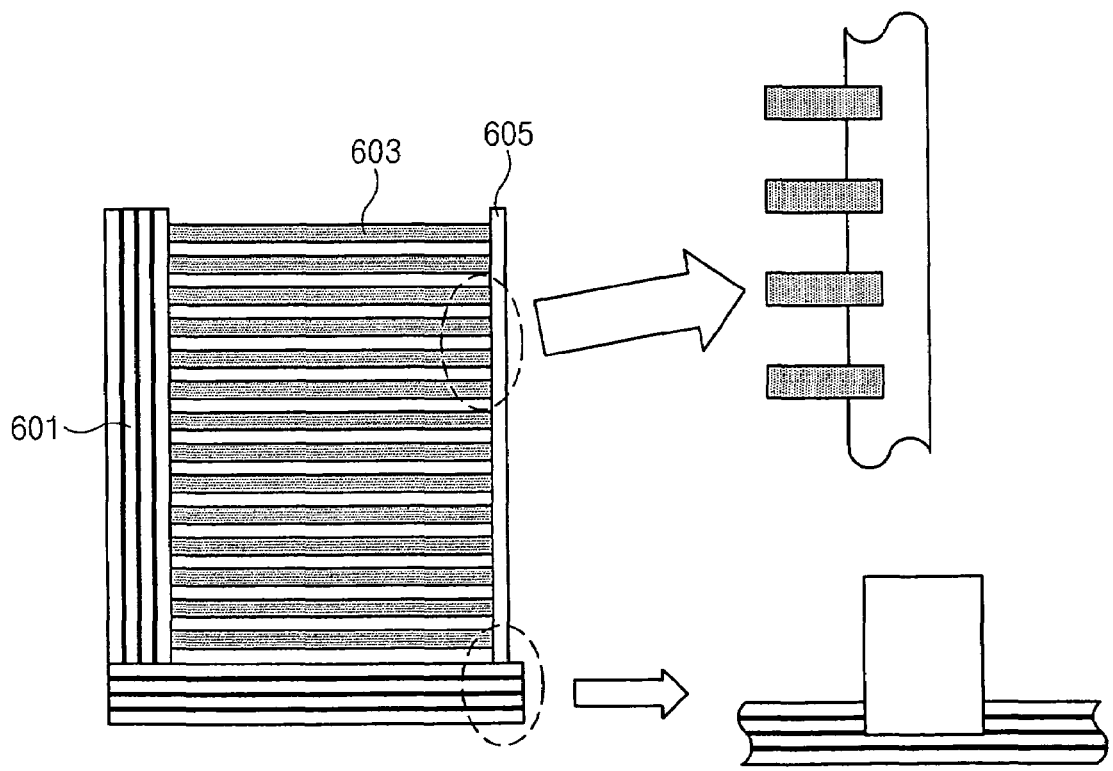
Figure 7:
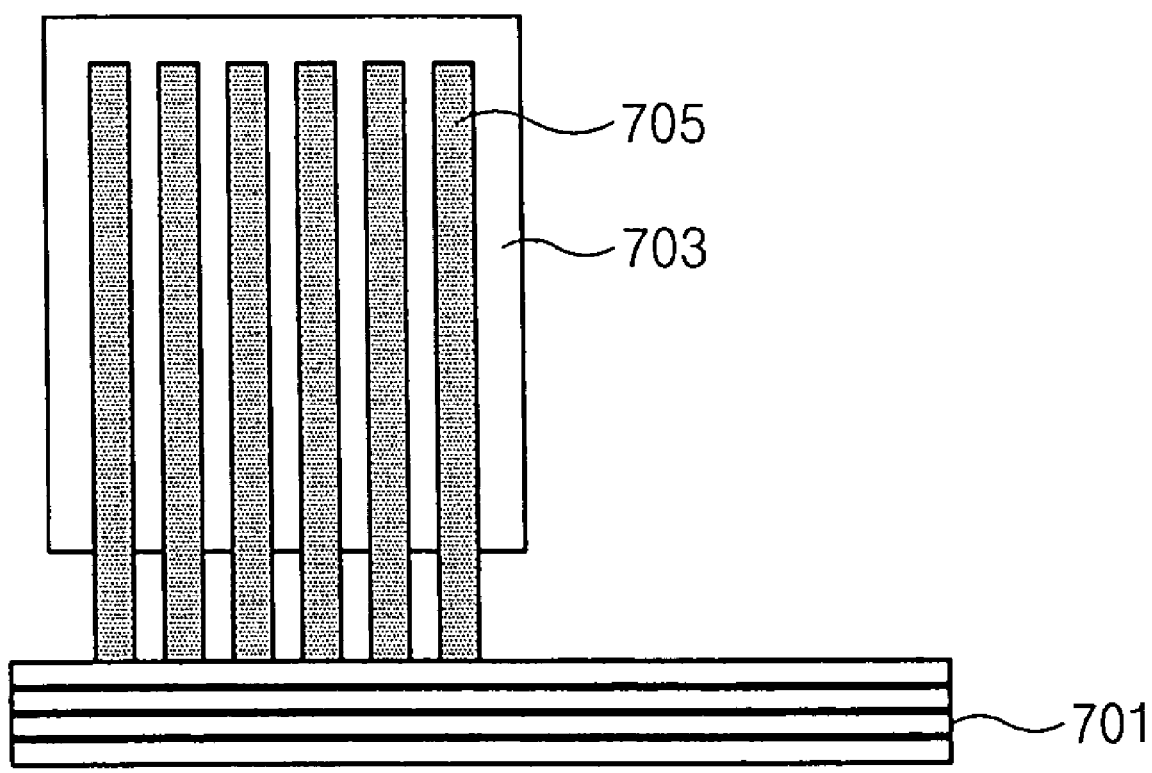

The memory modules of the first and second embodiments can be horizontally or vertically mounted to the main board of an electronic device. In the case of vertical mounting, for each module, the edge of the module having the input/output terminal is fixed to the main board, while the opposite free edge is not fixed and thus not supported to prevent movement. Any such movement of the memory modules can cause the substrates of the memory modules to crack and/or cause electrical shorts or opens to be formed within the modules. Accordingly, as shown in FIG. 6A, the free edges of the memory modules 603 may be supported between the main board 601 and a guardrail 605. The guardrail 605 may be equipped with a plurality of grooves for insertion and support of the free edges of the memory modules 603. Additional support can be provided as shown in FIG. 6B by using a support member (or an extension of the main board 601) to fix the guardrail 605 to the main board 601. FIG. 7 shows an alternative support configuration in which side edges of the memory modules 705 are attached to an underlying insulator support 703. Reference number 701 of FIG. 7 denotes the main board to which the modules 705 are attached.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A memory module comprising:
   a substrate comprising a common substrate body, a plurality of first memory chips located over a surface of the common substrate body, a conductive pattern which electrically connects at least some of the plurality of first memory chips, and an external terminal which is electrically connected to the conductive pattern; and
   at least one second memory chip mounted over a respective one of the plurality of first memory chips and electrically connected to the conductive pattern;
   wherein each one of the plurality of first memory chips mounted below the at least one second memory chip is disabled.

2. The memory module of claim 1, wherein each at least one second memory chip is electrically connected to the conductive pattern by wiring extending between a pad of each second memory chip and the conductive pattern.

3. The memory module of claim 2, wherein each one of the plurality of first memory chips mounted below the at least one second memory chip is electrically disconnected from the conductive pattern.

4. The memory module of claim 1, wherein each of the first memory chips includes a pad electrically connected to the conductive pattern, and wherein each of the at least one second memory chip includes a via hole aligned with the pad of the respective first memory chip, and a metal plug contained in the via hole which electrically contacts the pad of the respective first memory chip.

5. The memory module of claim 4, wherein each one of the respective first memory chips mounted below the at least one second memory chip includes a cut power supply fuse.

6. The memory module of claim 4, wherein the conductive plug is any one selected from the group consisting of aluminum, copper and platinum.

7. The memory module of claim 1, wherein a memory type of each of the plurality of first memory chips is independently any one selected from the group consisting of a DRAM, an SRAM and a flash memory.

8. The memory module of claim 7, wherein a memory type of each of the plurality of second memory chips is independently any one selected from the group consisting of a DRAM, an SRAM and a flash memory.

9. The memory module of claim 8, wherein a memory type of each of the at least one second memory chip is different than a memory type of the plurality of first memory chips.

10. The memory module of claim 1, wherein the common substrate body is a portion of a silicon wafer.

11. A memory module comprising:
    a substrate;
    a first memory chip located over a surface of the substrate;
    a conductive pattern electrically connected to pads of the first memory chip;
    an external terminal which is electrically connected to the conductive pattern;
    a stacked plurality of second memory chips mounted over the first memory chip and having via holes aligned with the pads of the first memory chip; and
    conductive plugs respectively contained in the via holes of the stacked plurality of second memory chips and electrically contacting a respective one of the pads of the first memory chip.

12. The memory module of claim 11, wherein a memory type of the first memory chip is any one selected from the group consisting of a DRAM, an SRAM and a flash memory.

13. The memory module of claim 12, wherein a memory type of each of the plurality of second memory chips is independently any one selected from the group consisting of a DRAM, an SRAM and a flash memory.

14. The memory module of claim 13, wherein a memory type of each of the second memory chips is different than a memory type of the first memory chip.

15. The memory module of claim 11, wherein the conductive plugs comprise any one selected from the group consisting of aluminum, copper and platinum.

16. The memory module of claim 1, wherein each one of the respective first memory chips mounted below the at least one second memory chip includes a cut power supply fuse.

17. The memory module of claim 1, wherein each one of the plurality of first memory chips mounted below the at least one second memory chip includes a logic circuit adapted to disable operation of the memory chip in response to an external command.

18. A memory module comprising:
    a substrate;
    a first memory chip at a surface of the substrate, the first memory chip including a plurality of pads;
    a conductive pattern on the substrate, electrically connected to the pads of the first memory chip;
    an external terminal which is electrically connected to the conductive pattern;
    at least one second memory chip mounted on the first memory chip and having via holes aligned with the pads of the first memory chip; and
    conductive plugs disposed within the via holes of the second memory chip, each said conductive plug electrically contacting a respective one of the pads of the first memory chip.

19. The memory module of claim 16, wherein a memory type of the second memory chip is different than a memory type of the first memory chip.

* * * * *